United States Patent [19]
Tomoeda

[11] Patent Number: 5,574,684
[45] Date of Patent: Nov. 12, 1996

[54] FLASH MEMORY HAVING DATA REFRESH FUNCTION AND DATA REFRESH METHOD OF FLASH MEMORY

[75] Inventor: Mitsuhiro Tomoeda, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 463,802

[22] Filed: Jun. 5, 1995

[30] Foreign Application Priority Data

Jan. 9, 1995 [JP] Japan ................................ 7-001303

[51] Int. Cl.$^6$ .............................. G11C 7/00; G11C 29/00
[52] U.S. Cl. .......................... 365/185.04; 365/185.09; 365/185.11; 365/185.22; 365/185.25; 365/185.29; 365/185.33; 365/189.07; 365/200; 365/201; 365/218; 365/222; 371/21.1; 371/21.2
[58] Field of Search .................... 365/185.04, 185.09, 365/185.11, 185.22, 185.25, 185.29, 185.33, 189.07, 200, 201, 218, 222; 371/21.1, 21.2

[56] References Cited

U.S. PATENT DOCUMENTS

| | | | |
|---|---|---|---|
| 5,337,281 | 8/1994 | Kobayashi et al. | 365/218 |
| 5,361,343 | 11/1994 | Kosonocky et al. | 365/218 |
| 5,379,256 | 1/1995 | Tanaka et al. | 365/185.22 |
| 5,414,664 | 5/1995 | Lin et al. | 365/218 |

FOREIGN PATENT DOCUMENTS 6-64918  8/1994  Japan.

OTHER PUBLICATIONS

Virgil Niles Kynett et al, An In–System Reprogrammable 32Kx8 CMOS Flash Memory, IEEE Journal of Solid–State Circuits, vol. 23, No. 5, Oct. 1988, pp. 1157–1163, is cited on p. 2 of the specification.

*Primary Examiner*—David C. Nelms
*Assistant Examiner*—Trong Phan
*Attorney, Agent, or Firm*—Lowe, Price, LeBlanc & Becker

[57] ABSTRACT

A flash memory and its data refresh method, where data read out in program verify mode and erase verify mode from read address are compared in each address (ST110), and data of a memory cell corresponding to inconsistent data are rewritten (ST112). Or adding values of data read out in the program verify mode and the erase verify mode are compared in each block (ST137) and a defective block is retrieved and data in each address are compared in the defective block (ST160), and data of a memory cell corresponding to inconsistent data are rewritten (ST162). Thereby, defective data can be retrieved and corrected.

14 Claims, 13 Drawing Sheets

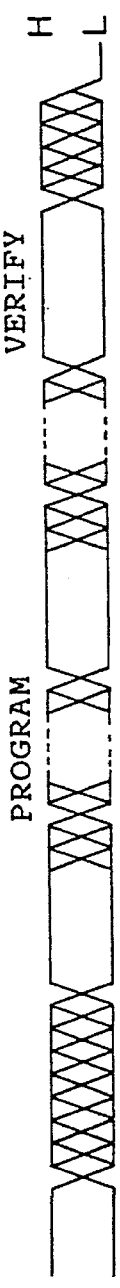
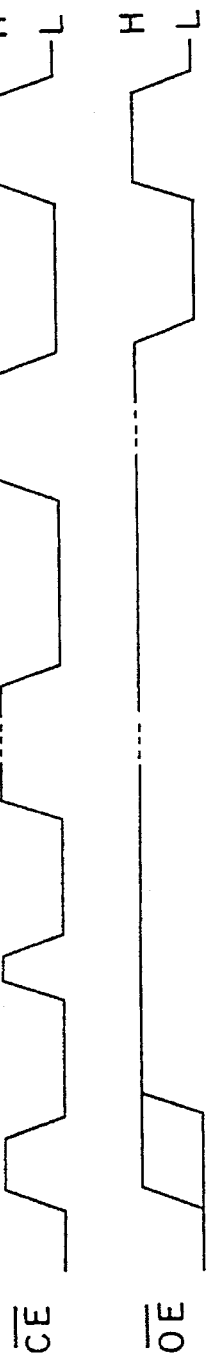
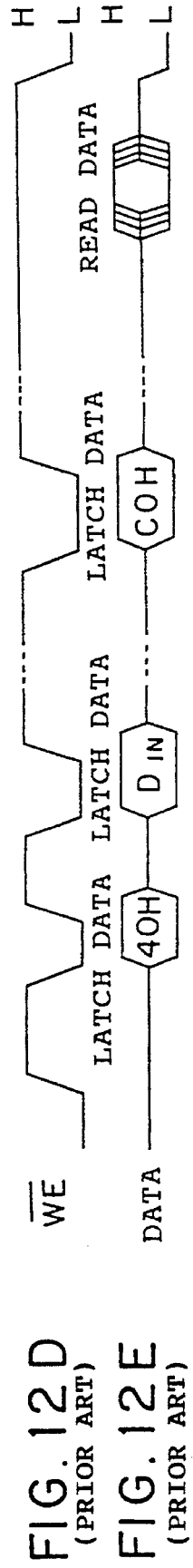
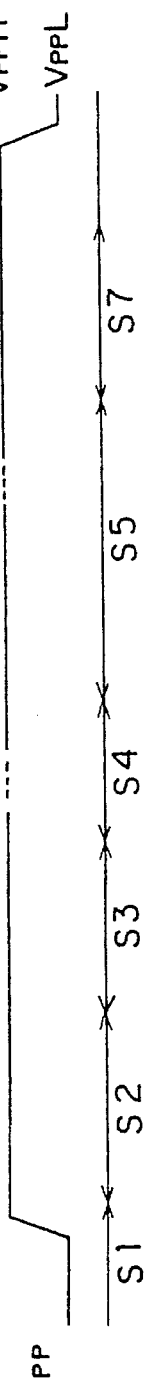

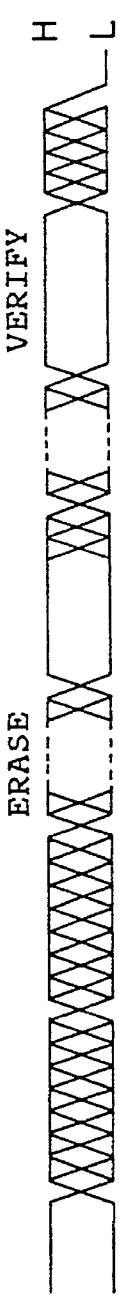
FIG. 13A
(PRIOR ART)
ADDRESS
FIG. 13B
(PRIOR ART)
$\overline{CE}$
FIG. 13C
(PRIOR ART)
$\overline{OE}$
FIG. 13D
(PRIOR ART)
$\overline{WE}$
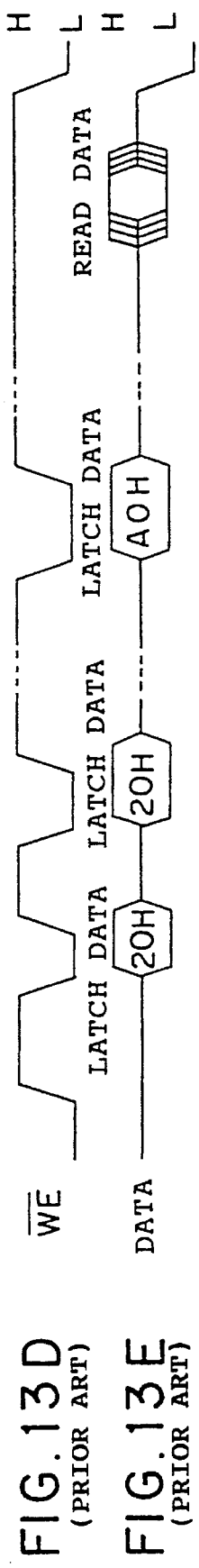
FIG. 13E
(PRIOR ART)
DATA
FIG. 13F
(PRIOR ART)
Vcc
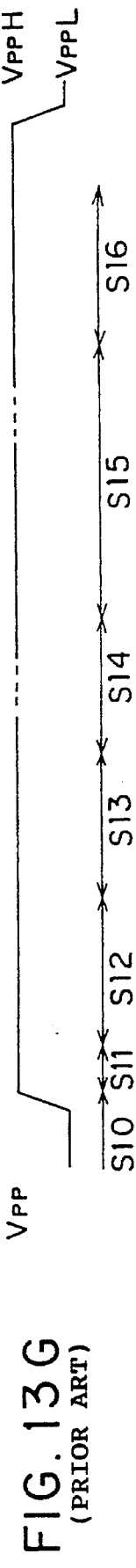
FIG. 13G
(PRIOR ART)
Vpp

FLASH MEMORY HAVING DATA REFRESH FUNCTION AND DATA REFRESH METHOD OF FLASH MEMORY

BACKGROUND OF THE INVENTION

1. Field of the Invention

The present invention relates to a flash memory having data refresh function and data refresh method of a flash memory where data varying after verify immediately after write or erase can be retrieved and corrected.

2. Description of the Prior Art

FIG. 7 is a block diagram of a flash memory in the prior art disclosed in IEEE Journal of Solid-State Circuits, Vol. 23, No. 5 (October, 1988), pp. 1157–1163.

As shown in FIG. 7, on periphery of a memory array 1 are installed a Y gate 2, a source line switch 3, an X decoder 4 and a Y decoder 5. An address register 6 is connected to the X decoder 4 and the Y decoder 5, and address signals inputted from the outside are inputted to the address register 6. An input data register (writing circuit) 7 and a sense amplifier 8 are connected to the memory array 1 through the Y gate 2. The input data register 7 and the sense amplifier 8 are connected to an I/O buffer 9. In the shown example, eight input/output lines I/O0–I/O7 are connected to the I/O buffer 9. A program voltage generating circuit 10 and a verify voltage generating circuit 11 are installed in the flash memory, and each of the generating circuits 10, 11 generates voltage in level of Vcc, Vpp supplied from the outside and supplies it to the Y gate 2, the decoder 4 or the like. Also a command register 12 and a command decoder 13 setting operation mode by data inputted from the outside are installed in the flash memory. Further, an input signal buffer 14 is installed, and control signals WE (low active), CE (low active), OE (low active) from the outside are inputted to the input signal buffer 14. In addition, in FIG. 7, bar is attached to each control signal, and clearly indicates that it is a low active signal.

FIG. 8 is a sectional view of a memory cell (memory transistor) constituting the memory array of FIG. 7. The memory cell comprises a floating gate 16 formed above a semiconductor substrate 15, a control gate 17, and a source diffusion region (hereinafter referred to as "source") 18 and a drain diffusion region (hereinafter referred to as "drain") 19 formed selectively on the surface of the semiconductor substrate 15. An oxide film 20 between the floating gate 16 and the semiconductor substrate 15 is so thin (about 100 angstrom) that electrons can be moved to the floating gate 16 utilizing the tunnel phenomenon. Next, operation of the memory cell will be described. At program state (writing state of information "0"), program voltage of about 6.5 V is applied to the drain 19, and voltage Vpp (12 V) is applied to the control gate 17, and the source 18 is grounded. Therefore the memory cell is turned on and a current flows. Then avalanche breakdown is produced in the vicinity of the drain 19 and electron/positive hole pair is generated. The positive holes flow through the semiconductor substrate 15 to the ground potential, and the electrons flow in the channel direction into the source 18. However, a part of electrons is accelerated by the electric field between the floating gate 16 and the drain 19 and injected into the floating gate 16. As a result, the threshold voltage of the memory cell rises. This state is defined as storage of the information "0."

On the other hand, erasing is carried out in the state that the drain 19 is opened and the control gate 17 is grounded and voltage Vpp is applied to the source 18. Then the tunnel phenomenon is produced due to the electric field between the source 18 and the floating gate 16, and drawing of electrons in the floating gate 16 occurs. As a result, the threshold voltage of the memory cell falls. This is defined as storage of the information "1."

FIG. 9 is a circuit diagram of the memory array and its peripheral circuit in FIG. 7. As shown in FIG. 9, the memory array comprises 32 blocks from BK1 to BK32 in the shown example, and each block comprises eight data blocks from DB1 to DB8. In each data block, memory cells MC are arranged in matrix form, and in column unit, drains are connected to bit lines BL (BL1–BL3) respectively, and in row unit, control gates are connected to word lines WL (WL1–WL3) respectively. The word lines WL are connected to an X decoder 4, and the bit lines BL are connected to an I/O line 27 through transistors constituting Y gates 2 to whose gates are inputted outputs Y1–Y3 of a Y decoder 5 respectively. A sense amplifier 8 and an input data register 7 are connected to the I/O line 27, and sources of all memory cells MC are connected through a source line 28 to a source line switch 3.

Next, operation will be described. At first, description will be done in an example that writing (program) is carried out in memory cells MC enclosed by dotted line in FIG. 9. The input data register 7 is activated in response to data inputted from the outside, and program voltage is supplied to the I/O line 27. At the same time, based on address signals (not shown) fetched by the X decoder 4 and the Y decoder 5, the Y decoder 5 makes its output Y1 active state and the Y gate 2, to which the output Y1 is applied, is turned on, and the X decoder 4 selects the word line WL1 and applies voltage Vpp to it. The source line 28 is grounded by the source line switch 3.

Then current flows through only one memory cell enclosed by the dotted line in FIG. 9, and hot electrons are generated and the threshold voltage becomes high and the information "0" is written.

Erasing is carried out as follows. At first, the X decoder 4 and the Y decoder 5 are non-activated, and all memory cells are made non-selective. That is, the control gate 17 of each memory cell is grounded and the drain 19 is made open, and on the other hand, high voltage is supplied to the source line 28 by the source line switch 3. Thus the threshold voltage of the memory cell is shifted lower by the tunnel phenomenon, and the information "1" is written. Since the source line 28 is common in the chip or in the block, erasing is carried out to all memory cells MC together in the chip or in the block.

Next, reading operation will be described in the case taken as an example that reading is carried out from the memory cells MC enclosed by the dotted line in FIG. 9. At first, address signals are decoded by the Y decoder 5 and the X decoder 4, and the selected Y gate 2 (output Y1 applied) and the word line WL1 become "H" (Vcc). Then the source line 28 is grounded by the source line switch 3. When "0" is written in the memory cell MC, since the threshold voltage is high, even if "H" is supplied to the control gate 17 of the memory cell MC by the word line WL1, the voltage is lower than the threshold voltage of the memory cell, so that the memory cell MC is not turned on and no current flows from the bit line BL1 to the source line 28.

On the other hand, when the memory cell is erased (in the case of "1"), since the voltage "H" applied to the control gate 17 is higher than the threshold voltage of the memory cell, the memory cell is turned on and current flows from the bit line BL1 to the source line 28.

Consequently, the sense amplifier 8 detects whether current flows through the memory cell MC or not, thereby the read data "1" or "0" are obtained.

When one word is constituted by plural bits, in the actual reading operation, one read address is assigned, thereby data of plural bits are read out simultaneously. For example, when one word is constituted by eight bits as in the shown example, in the actual reading operation, one word line and eight bit lines are simultaneously selected in response to assignment of one read address. The selected eight bit lines are corresponding bit lines in the eight data blocks DB1, DB2, . . . DB8 respectively.

Since erasing is carried out by ultraviolet irradiation in the EPROM, when the floating gate becomes neutral electrically, electrons are not drawn further from the floating gate and the threshold voltage of the memory transistor does not become about 1 V or less.

On the other hand, in drawing of electrons utilizing the tunnel phenomenon of the EEPROM or the like used in the flash memory, electrons are drawn excessively from the floating gate thereby it may occur that the floating gate is charged to plus. This phenomenon is called over erase (or excess erase). When the over erase is carried out, since the threshold voltage of the memory transistor becomes minus, the later reading/writing is obstructed.

That is, in the flash memory, even if level of the word line is "L" at non-selective state during reading and level applied to the control gate of the memory transistor is "L," since current flows from the bit line BL to the source line 28 through the memory transistor in over erase, although the memory cell intended to carry out reading on the same bit line has high threshold voltage at "0" write state, current flows through the memory transistor in the over erase, thereby "1" is read out wrongly. Also during writing, since leak current flows through the memory cell in the over erase, the memory cell intended to carry out writing is deteriorated in writing characteristics and further becomes capable of not writing. Therefore in the flash memory, the erasing operation is carried out step by step, and reading is carried out after erasing and it is checked whether the erasing has been carried out correctly (hereinafter referred to as "verify"). If there is any bit being not erased, erasing is carried out again and the erase pulse causing the over erase is prevented from being applied to the memory cell, in conventional method.

FIG. 10 and FIG. 11 are flow charts showing the program and the erase operation including the above-mentioned verify operation, and FIG. 12A–FIG. 12G and FIG. 13A–FIG. 13G are waveform charts showing timing of respective operations. Using these FIG. 10 to FIG. 13 and FIG. 7, each process of erase and program will be described. In conventional flash memory, mode setting of erase and program is carried out by combination of input data. In other words, the mode setting is carried out by input data at rise state of WE (low active).

First, the case of program will be described by FIG. 10 and FIG. 12. At first, voltage Vcc, Vpp is raised (step ST1), and then the control signal WE is dropped.

At rise of next control signal WE, the input data (40H) indicating the program mode are latched to the command register 12 (step ST2). And then the input data are decoded by the command decoder 13, and the operation mode becomes the program mode. Subsequently, the control signal WE is dropped again and address from the outside is latched to the address register 6, and data DIN are latched to the write circuit 7 at rise of the control signal WE (step ST3). Next, program pulse is generated by the program voltage generating circuit 10 and applied to the X decoder 4 and the Y decoder 5. Thus the program ("0" write) operation is carried out as above described (step ST4).

Next, the control signal WE is dropped, and at rise of the subsequent control signal WE, the input data (COH) indicating the program verify mode are latched to the command register 12 and the operation mode becomes program verify mode (step ST5). Then the program verify voltage (about 7.0 V) is generated within the chip by the erase/program verify voltage generating circuit 11 and applied to the X decoder 4. Since this program verify voltage supplied to the control gate 17 of the memory cell is higher than the voltage 5 V at usual reading state, due to insufficient writing, the memory cell with the threshold voltage lowered can be easily turned on, thereby defective writing can be generated more securely. Next, reading is carried out (step ST6), and if "1" is read out, it can be securely detected as defective writing. If it is defective writing, writing is repeated further. If "0" is read out thereby, decision is effected that the writing is normal (step ST8), the operation mode is set to the read mode and the program is finished.

Next, the case of erase will be described referring to FIG. 11 and FIG. 13. At first, voltage Vcc, Vpp is raised (step ST10), and subsequently "0" is written in all bits using the above-mentioned program flow (step ST11). This is because if an erased memory cell is further erased, the memory cell will become over erase. Next, the control signal WE is dropped and at rise of succeeding control signal WE, erase command (2OH) is inputted (ST12). Subsequently the control signal WE is dropped again, and at rise of succeeding WE, erase confirmation command (2OH) is inputted (step ST13). Then erase pulse is generated within the chip, and until fall of succeeding control signal WE, voltage Vpp is applied to the source 18 of the memory cell through the source line switch 3 (step ST14). At this fall, the address is also latched. Thus erase operation of the memory cell (write of "1") is executed. At rise of succeeding control signal WE, erase verify command (COH) is latched and the operation mode becomes erase verify mode (step ST15). Then erase verify voltage (about 3.2 V) is generated by the erase/program verify voltage generating circuit 11 and applied to the X decoder 4. Since the erase verify voltage supplied to the control gate 17 of the memory cell is lower than the voltage (5 V) at usual reading state, due to insufficient erase, the memory cell with the threshold voltage higher than that of the memory cell in sufficient erase cannot be easily turned on. Consequently, reading after the erase operation is carried out (step ST16), and "0" is read out, thereby, decision is effected that erase is insufficient (step ST17). If erase is insufficient, erase is further repeated. If "1" is read out thereby it is confirmed that erase has been carried out, address is incremented (step ST19), and erase data of next address are verified. If the verified address is the last address (step ST18), the operation mode is set to read mode (step ST20), and the erase operation is finished.

Since the conventional flash memory is constituted as above described, at program state for some memory cell, program verify operation for the memory cell only is carried out immediately after the writing, and verify operation for a memory cell in non-selective state is not carried out.

When a program is carried out for some memory cell, since high voltage Vpp is applied also to a control gate of a memory cell MC in non-selective state connected to the selected word line WL, when the memory cell in non-selective state stores "0," there is a problem in that charge of the floating gate is drawn by the control gate due to the tunnel phenomenon and the stored data may be changed to "1." Or, since Vcc is applied also to drain of a memory cell in non-selective state connected to the bit line BL selected at program state, when the memory cell in non-selective state stores "0," there is a problem in that charge of the floating gate is drawn by the drain due to the tunnel phenomenon and the stored data may be changed to "1."

Further, there is a problem in that charged data within the memory cell become volatile on account of the heat or the like.

Such phenomenon is frequently generated that data cannot be held as a result that the memory size is more decreased attendant on large capacity of a memory.

Further, when the flash memory is used as a file memory, the number of times of rewrite of the memory is increased, and in each rewrite, disturb stress for cells in non-selective state connected to the selected word line WL or the selected bit line BL is added as above described, and holding of data becomes difficult.

In the prior art, a flash memory which holds data varied to defective data after the verify operation of the data immediately after the write of data or immediately after the erase of data is found only by test before the shipment. If a defective flash memory is found then, since the flash memory must be inevitably abandoned, there is a problem in that manufacturing of the flash memory comes to nothing resulting in rise of the memory price.

SUMMARY OF THE INVENTION

In order to solve the above-mentioned problems in the prior art, an object of the present invention is to provide a flash memory having data refresh function, where program verify mode and erase verify mode are utilized skillfully, thereby, in addition to verify operation immediately after write of data or immediately after erase of data, a memory cell which holds defective data can be specified and the defective data can be corrected.

Another object of the present invention is to provide a flash memory having data refresh function, where program verify mode and erase verify mode are utilized, and at first, a block with defective data existing is specified, subsequently, the above-mentioned memory cell can be specified and the defective data are corrected, thereby, the defective data can be retrieved and corrected in a short time.

A further object of the present invention is to provide data refresh method of a flash memory, where program verify mode and erase verify mode are utilized skillfully, thereby, in addition to verify operation immediately after write of data or immediately after erase of data, a memory cell which holds data can be specified and the defective data can be corrected.

Still another object of the present invention is to provide data refresh method of a flash memory, where program verify mode and erase verify mode are utilized, and at first, a block with defective data existing can be specified, subsequently, the above-mentioned memory cell can be specified and the defective data are corrected, thereby, the defective data can be retrieved and corrected in a short time.

A flash memory having data refresh function according to the first aspect of the present invention comprises comparing means for comparing data read out in program verify mode in response to assignment of read-out address and data read out in erase verify mode in response to assignment of the same address as the read-out address, and rewrite control means for controlling data rewrite of a memory cell corresponding to inconsistent data when the inconsistent data are detected by the comparing means.

As stated above, in the flash memory having data refresh function in the first aspect of the present invention, data read out in program verify mode and data read out in erase verify mode are compared in each address, thereby, even if data are varied and become defective data after verify immediately after write in the memory cell or immediately after erase, the defective data of any address can be retrieved and corrected.

In the invention of the first aspect, it is preferable that address incrementing means is provided for incrementing the read-out address when coincidence is detected by the comparing means or after rewrite by the rewrite control means.

As stated above, address is incremented when the compared results are coincident or after correction of data, thereby, the defective data can be retrieved and corrected regarding all memory cells in the flash memory.

A flash memory having data refresh function according to the second aspect of the present invention comprises comparing means for comparing adding result of data read out in program verify mode and adding result of data read out in erase verify mode among all memory cells of one of plural blocks and for comparing data read out in program verify mode in response to assignment of read-out address and data in erase verify mode in response to assignment of the same address as the read-out address, in the block where inconsistency of the adding results is detected, and rewrite control means for controlling data rewrite of a memory cell corresponding to inconsistent data when the inconsistent data are detected by the comparing means.

As stated above, in the flash memory having data refresh function in the second aspect of the present invention, since defective data are retrieved in each block and the defective data of any address in the defective block are retrieved and corrected, the defective data of any address can be retrieved and corrected further in a short time in comparison with the invention of the first aspect.

In the invention of the second aspect, it is preferable that read address incrementing means is provided for incrementing the read-out address when coincidence is detected by the comparing means or after rewrite by the rewrite control means, and block address incrementing means is provided for incrementing the block address when coincidence of the adding results is detected by the comparing means or after rewrite by the rewrite control means.

As stated above, address is incremented when the compared results are coincident or after correction of data, and block address is incremented when the adding results are coincident within the block or after correction of data, thereby, the defective data can be retrieved and corrected regarding all memory cells within the flash memory further in a short time in comparison with the invention of the first aspect.

In the invention of the first or second aspect, it is preferable that each of the first memory means and the second memory means stores data comprising one or more bits, and rewrite control means controls rewrite of only data of the memory cell corresponding to inconsistent bits.

As stated above, data comprising one or more bits are compared in response to one read-out address signal, and only data of the memory cell corresponding to inconsistent bits are rewritten, the defective data can be retrieved and corrected efficiently.

Further, it is preferable that the rewrite control means rewrites data of the memory cell corresponding to the inconsistent bits in information write state.

As stated above, whether correct data are in information write state or information erase state, the defective data are rewritten in information write state, thereby, the defective data can be corrected simply.

The third aspect of the present invention provides data refresh method of a flash memory comprising: step of reading data in program verify mode in response to assignment of read-out address; step of reading data in erase verify mode in response to assignment of the same address as the read-out address; step of comparing the data read out; and step of rewriting data of the memory cell corresponding to inconsistent data when the inconsistent data are detected by the comparison.

As stated above, according to the data refresh method of the flash memory in the third aspect of the present invention, since data read out in program verify mode and data read out in erase verify mode are compared in each address and it is detected whether the data are inconsistent or not, even if data are varied and become defective data after verify immediately after write in the memory cell or immediately after erase, the defective data of any address can be retrieved and corrected.

It is preferable that the invention of the third aspect further provides step of incrementing the read-out address when coincidence is detected by the comparison or after the rewrite.

As stated above, in the invention of the third aspect, since read-out address is incremented after the rewrite of defective data, the defective data can be retrieved regarding all memory cells within the flash memory.

The fourth aspect of the present invention provides data refresh method of a flash memory comprising: step of comparing adding result of data read out in program verify mode and adding result read out in erase verify mode among all memory cells of one of plural blocks, and comparing data read out in program verify mode in response to assignment of read-out address and data read out in erase verify mode in response to assignment of the same address as the read-out address, within the block where inconsistency of the adding results is detected; and step of rewriting data of the memory cell corresponding to inconsistent data when the inconsistent data are detected by the comparison.

As stated above, according to the data refresh method of the flash memory in the fourth aspect of the present invention, since defective data are retrieved in each block and the defective data of any address within the defective block are retrieved and corrected, the defective data of any address can be retrieved and corrected further in a short time in comparison with the invention of the third aspect.

It is preferable that the invention of the fourth aspect further provides step of incrementing the read-out address, when coincidence of data in the assigned read-out address is detected by the comparison or after rewrite by the rewrite control means, and step of incrementing the block address, when coincidence of the adding results is detected by the comparison or after the rewrite.

As stated above, address is incremented when the compared results are coincident or after correction of data, and block address is incremented when the adding results in the block are coincident or after correction of data, thereby the defective data can be retrieved and corrected regarding all memory cells in the flash memory further in a short time in comparison with the invention of the third aspect.

In the invention of the third aspect or the fourth aspect, it is preferable that in storing step, data comprising one or more bits are stored in response to one read-out address, and in rewriting step, only data of the memory cell corresponding to inconsistent bits are rewritten when the inconsistent bits are detected by the comparison.

As stated above, data comprising one or more bits are compared and only data of the memory cell corresponding to inconsistent bits are rewritten, thereby, in addition to actions of the third aspect or the fourth aspect, the defective data can be retrieved and corrected efficiently.

In the invention of the fourth aspect, it is preferable that in rewriting step, data of the memory cell corresponding to inconsistent bits are rewritten in information write state.

As stated above, whether correct data are in information write state or information erase state, the defective data are rewritten in information write state, thereby, the defective data can be corrected simply.

The fifth aspect of the present invention provides data refresh method of a flash memory where order of program verify mode and erase verify mode in the invention of the third aspect is reversed.

Even if order of program verify mode and erase verify mode in the invention of the third aspect is reversed as stated above, the defective data can be retrieved and corrected in similar manner to the invention of the third aspect.

The sixth aspect of the present invention provides data refresh method of a flash memory where order of program verify mode and erase verify mode in the invention of the fourth aspect is reversed.

Even if order of program verify mode and erase verify mode is reversed as stated above, the defective data can be retrieved and corrected in similar manner to the invention of the fourth aspect.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

BRIEF DESCRIPTION OF THE DRAWINGS

FIG. 12A to FIG. 12G are timing charts explaining program operation including verify operation in the prior art; and FIG. 13A to FIG. 13G are timing charts explaining erase operation including verify operation in the prior art.

DESCRIPTION OF THE PREFERRED EMBODIMENTS

Embodiment 1

An embodiment of the present invention will be described referring to the accompanying drawings as follows.

Figure 1:
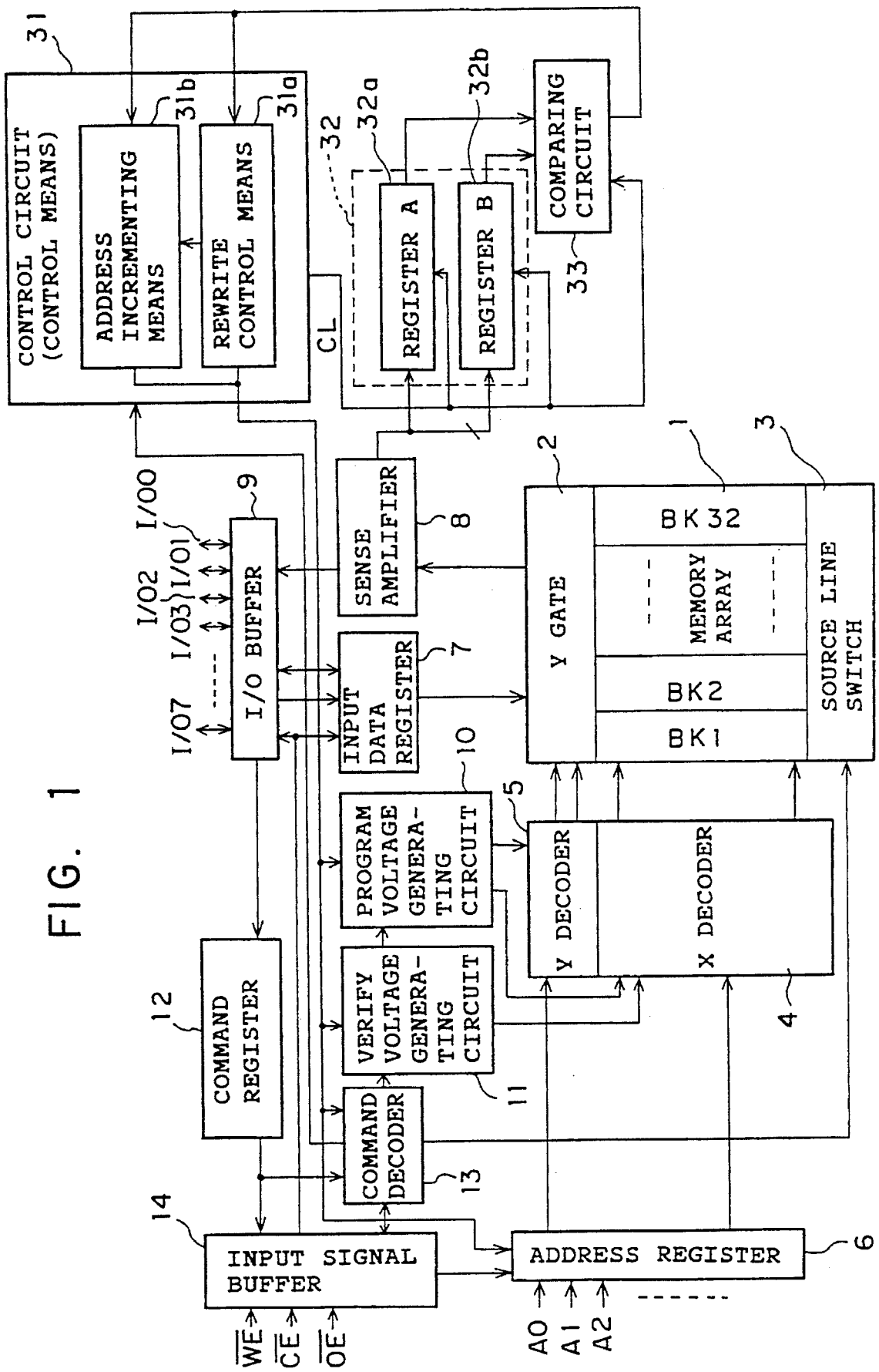
FIG. 1 is a block diagram showing constitution of a flash memory according to the embodiment 1 of the invention.

FIG. 1 is a block diagram showing constitution of a flash memory according to the embodiment 1 of the present invention. In FIG. 1, a control circuit (control means) 31 is activated when command inputted from an I/O buffer 9 and decoded by a command decoder 13 is refresh command of defective data, and controls a register group 32 and a comparing circuit 33, and assigns a read-out address and sets program verify mode and erase verify mode in different timing at verify operation state. When inconsistent data are detected by the comparing circuit 33, rewrite control means 31a controls to rewrite only data of a memory cell corresponding to the inconsistent data. When coincidence is detected by the comparing circuit 33 or after the rewrite of data, address incrementing means 31b controls to increment the read-out address. The register group 32 comprises two registers, a register A (first memory means) 32a and a register B (second memory means) 32b, both to be used when it is checked whether data stored in the memory cell are defective or not. The register A 32a stores data read out in program verify mode and in response to a read-out address signal, and the register B 32b stores data read out in erase verify mode and in response to the same read-out address signal as that described above. The comparing circuit (comparing means) 33 compares data stored in the two registers 32a and 32b and transmits the compared results to the control circuit 31.

Figure 7:
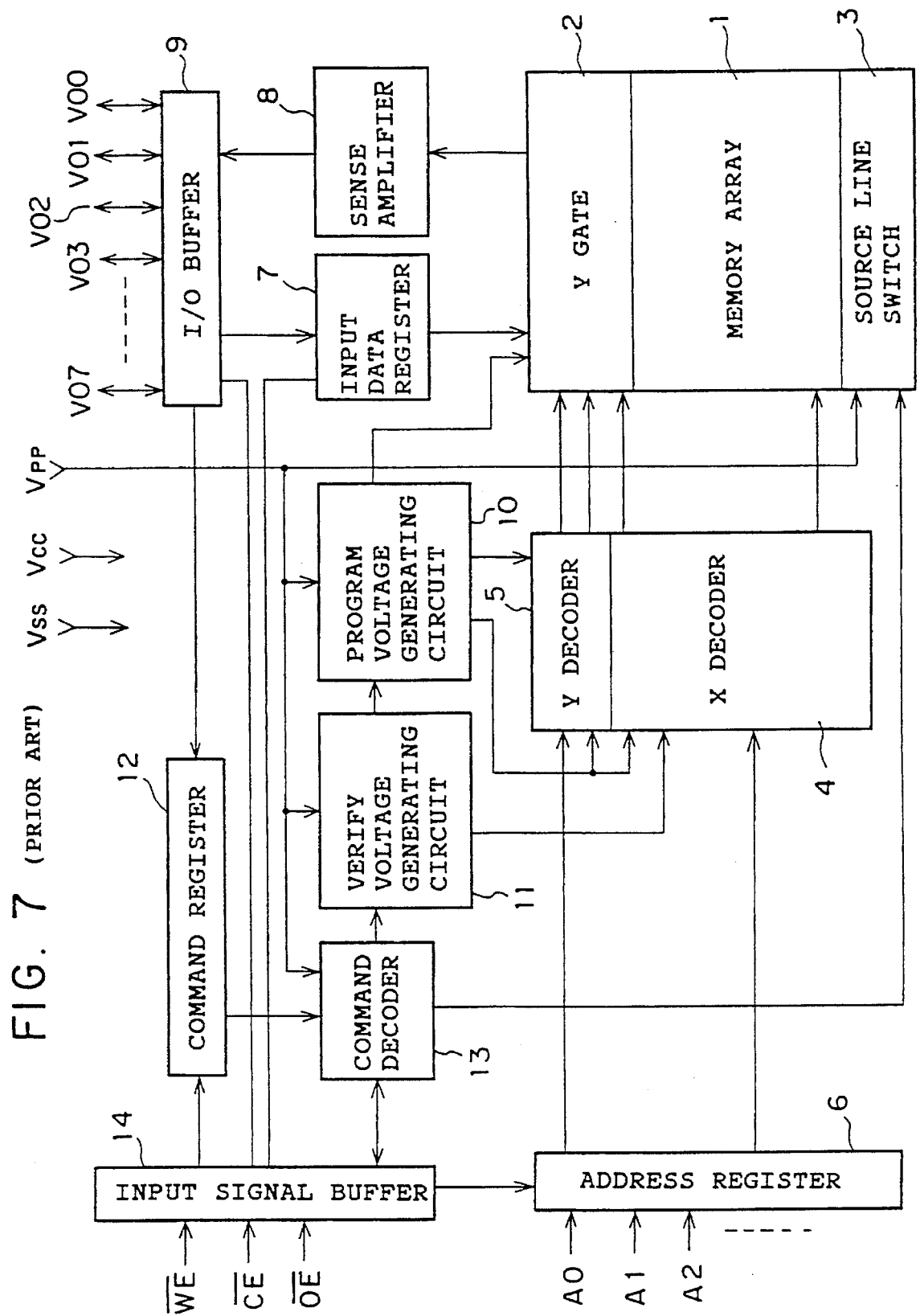
FIG. 7 is a block diagram of a flash memory in the prior art.
Figure 8:
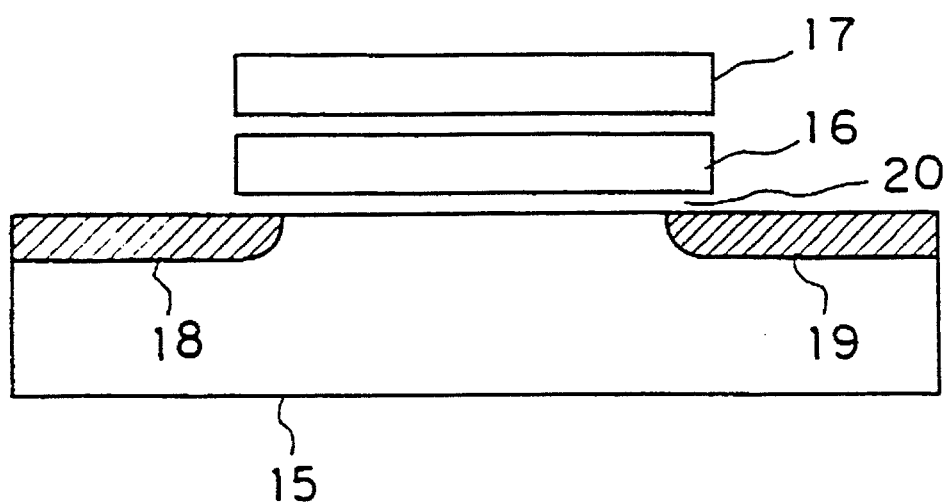
FIG. 8 is a sectional view of a memory cell (memory transistor) to constitute the memory cell in FIG. 7.
Figure 9:
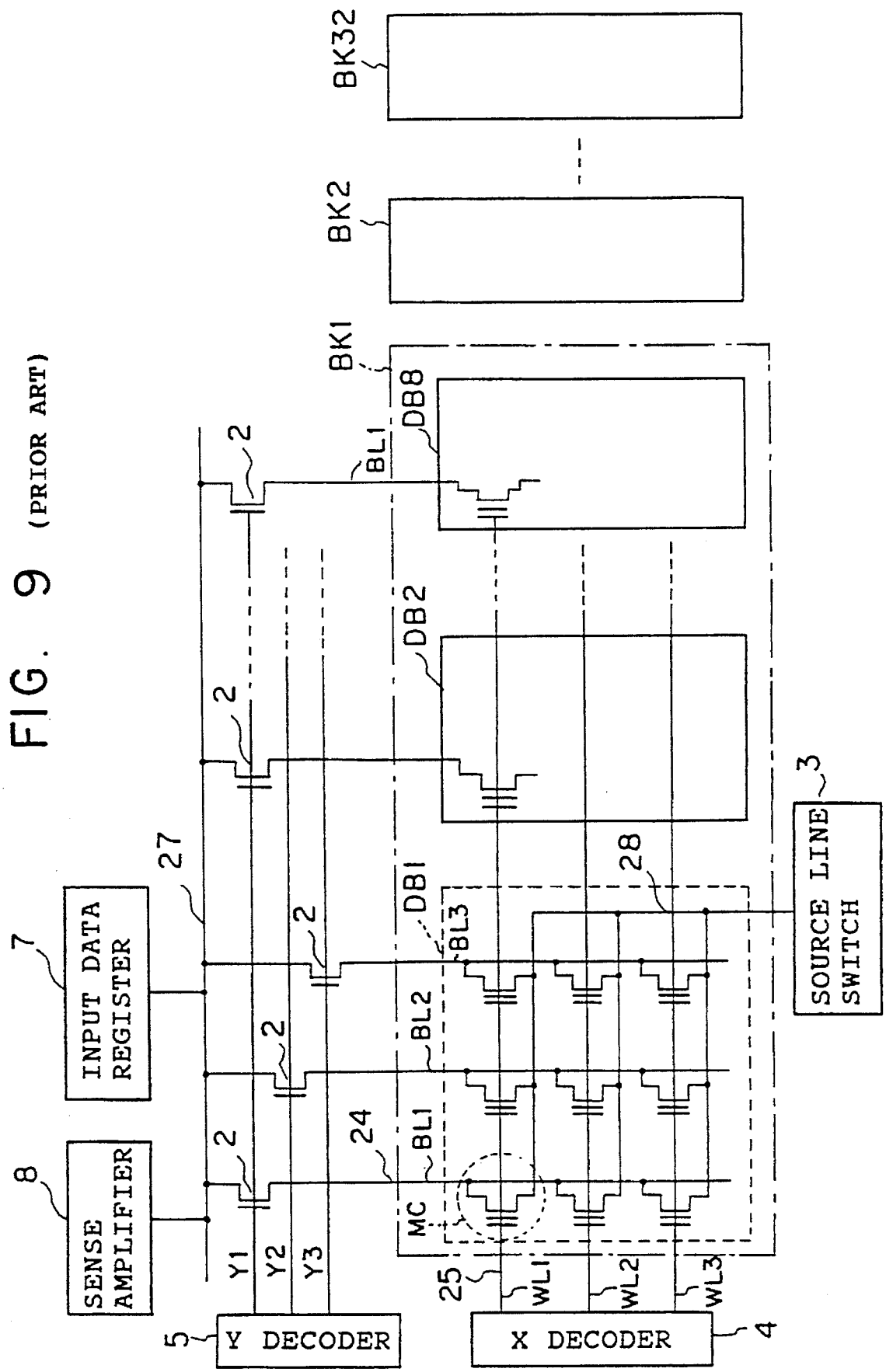
FIG. 9 is a circuit diagram of the memory array and its peripheral circuit in FIG. 7.
Figure 10:
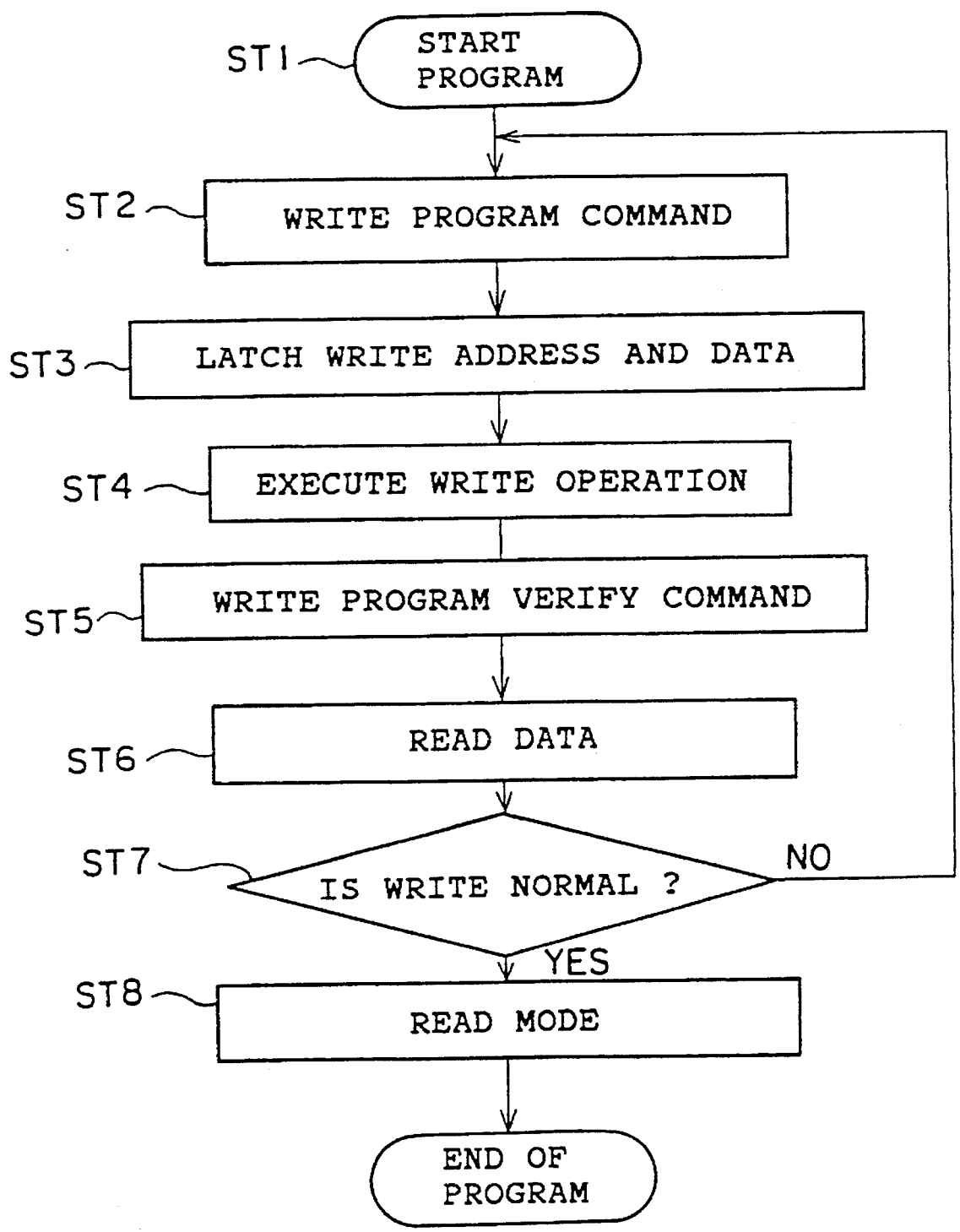
FIG. 10 is a flow chart explaining program operation including verify operation in the prior art.
Figure 11:
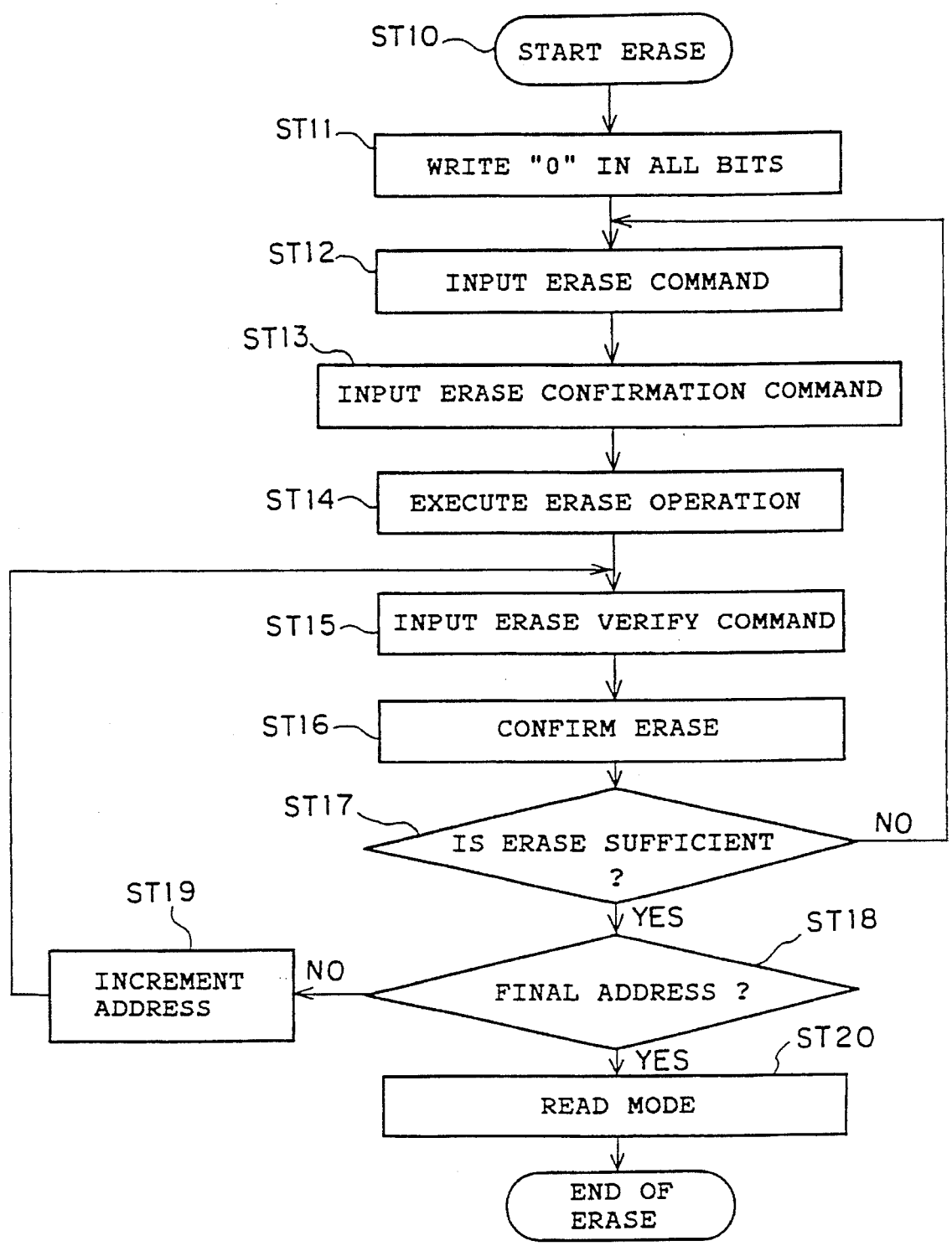
FIG. 11 is a flow chart explaining erase operation including verify operation in the prior art.

Other parts from 1 to 14 in FIG. 1 are the same as those in the flash memory in the prior art shown in FIG. 7, and the description shall be omitted. In addition, the memory array 1 in this embodiment is also constituted, for example, by 32 blocks BK1–BK32 in similar manner to the prior art shown in FIG. 9, and each block comprises eight data blocks DB1–DB8, however, the number of blocks and the number of data blocks, of course, can be selected arbitrarily in response to the design.

The rewrite control means 31a and the address incrementing means 31b are installed in the control circuit 31 in the shown example, but may be installed separately from the control circuit 31.

In order to correct defective data, the defective data must be retrieved, that is, address with the defective data existing and defective bits stored in the address must be specified. In order to realize this, program verify mode and erase verify mode are used according to the embodiment of the present invention.

Figure 2:
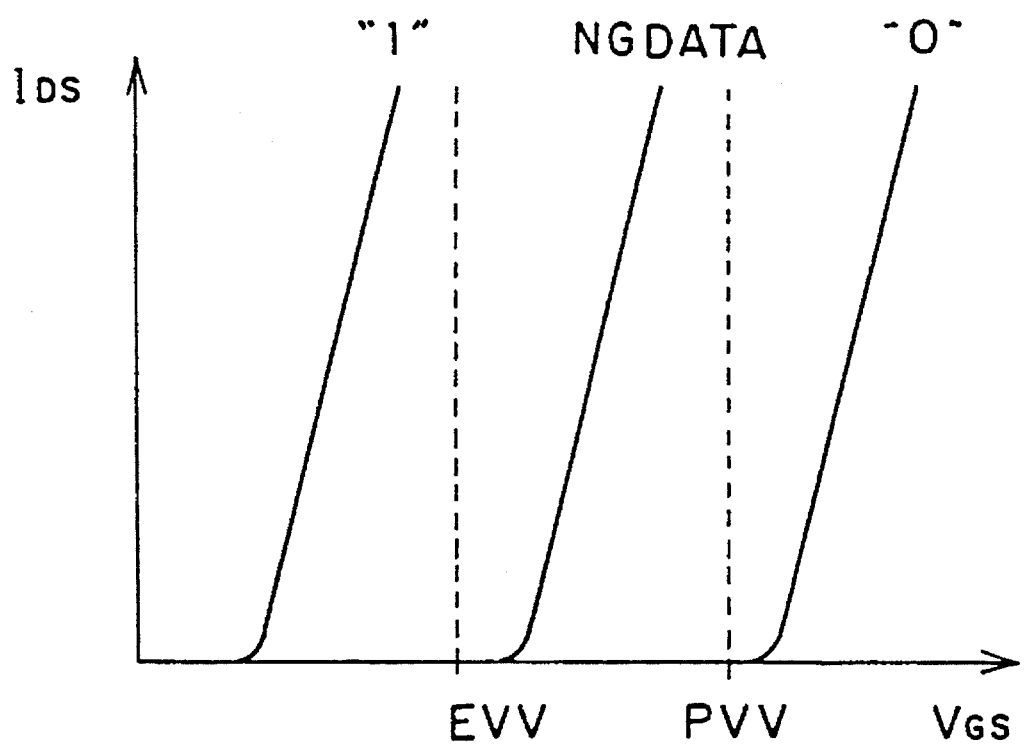
FIG. 2 is a graph diagram showing characteristics between VGS and IDS of a memory cell explaining principle of retrieval of defective data according to the invention.

FIG. 2 is a graph diagram explaining principle of retrieval of defective data according to the embodiment of the present invention, showing characteristics between voltage VGS between control gate and source of a memory cell and current IDS between drain and source.

When the memory cell is normal, threshold voltage Vth of the memory cell is higher than program verify voltage PVV when data stored in the memory cell are "0," and threshold voltage Vth of the memory cell is lower than erase verify voltage EVV when data stored in the memory cell are "1."

If the memory cell is read out in this normal state, whether the read-out mode is program verify mode or erase verify mode, data of "0" are read out as "0" and data of "1" are read out as "1."

If the memory cell becomes defective, the threshold voltage becomes that shown as NG data in FIG. 2. As a result, when data stored in the memory cell are "0," the shifted threshold voltage of the memory cell becomes lower than the program verify voltage PVV, and when data stored in the memory cell are "1," the shifted threshold voltage of the memory cell becomes higher than the erase verify voltage EVV.

Consequently, when the threshold value of the memory cell with "0" or "1" stored therein is varied to the threshold value shown as the NG data, if the memory cell is read out in program verify mode, since the shifted threshold voltage is lower than PVV, the memory cell is read out as "1," and if the memory cell is read out in erase verify mode, since the shifted threshold voltage is higher than EVV, the memory cell is read out as "0."

Thus if the memory cell becomes defective, data read out in program verify mode and data read out in erase verify mode are different.

Therefore, in the embodiment of the present invention, defective data are retrieved utilizing this phenomenon.

Figure 3:
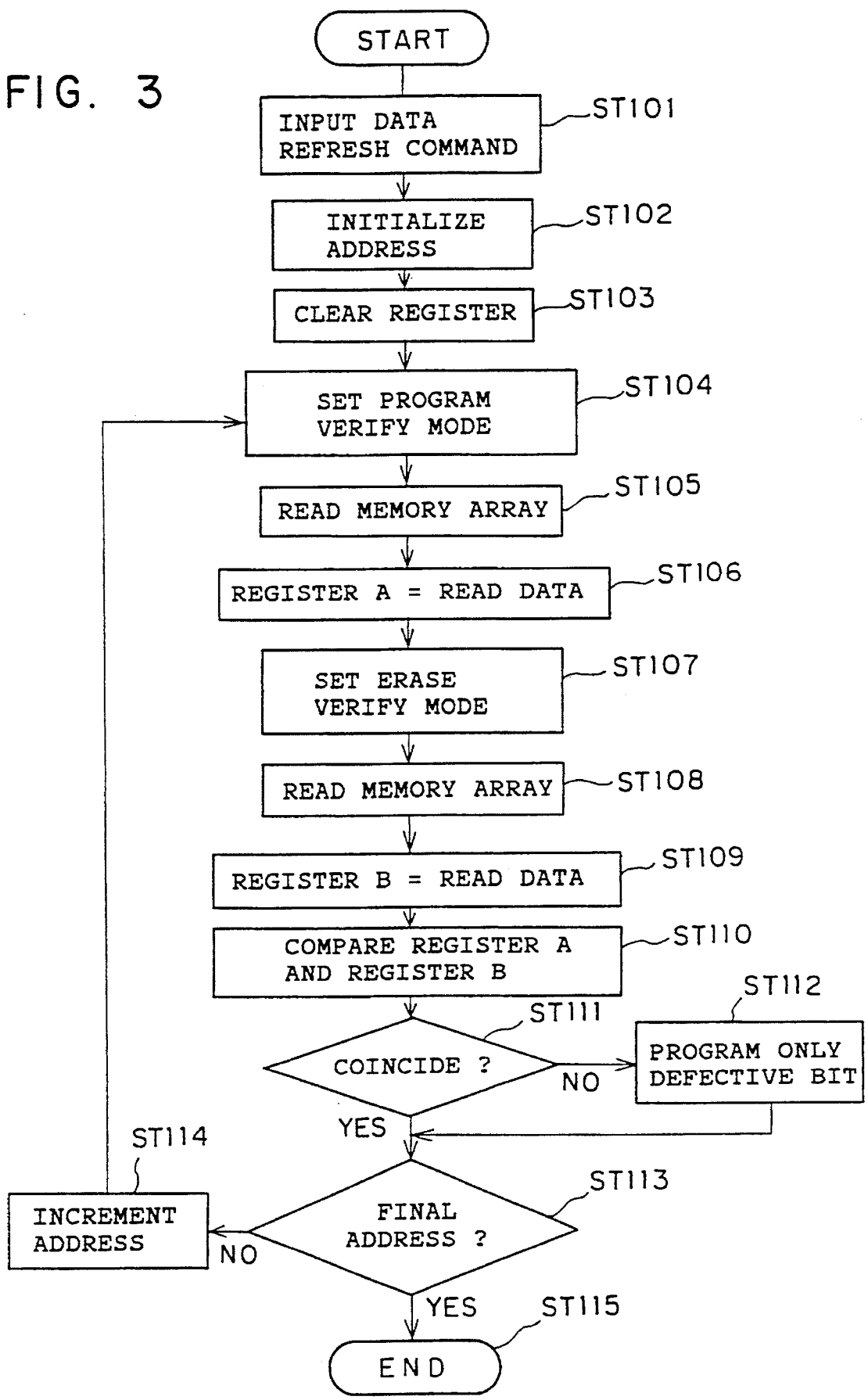
FIG. 3 is a flow chart explaining data refresh operation of the flash memory shown in FIG. 1.

Next, operation will be described. FIG. 3 is a flow chart explaining data refresh operation in the flash memory shown in FIG. 1. In FIG. 1 and FIG. 3, at first, data refresh command is inputted from the I/O buffer 9 to the command decoder 13 (step ST101). The command decoder 13 decodes the data refresh command and inputs it to the control circuit 31. Thereby, the control circuit 31 makes the operation mode data refresh mode. Subsequent operation is controlled by the control circuit 31.

The control circuit 31 first controls the address register 6 and initializes the read-out address, for example, to the front address of the flash memory (step ST102).

Next, content of the register A 32a and the register B 32b is cleared (step ST103).

Subsequently, the operation mode is set to program verify mode (step ST104). Thereby, the verify voltage generating circuit 11 generates program verify voltage PVV and supplies it to the decoder 4.

Next, an address signal assigning the front address from the address register 6 is supplied to the X decoder 4 and the Y decoder 5, and data stored in plural memory cells, eight memory cells in this example, assigned by the front address of the memory array 1, are read out simultaneously (step ST105). Then, the program verify voltage PVV is applied to the control gate of the memory cell of each block read out through the X decoder 4.

The data read out are amplified by the sense amplifier 8 and become read data RD, and the read data RD are stored in the register A 32a in response to a clock signal CL from the control circuit 31 (step ST10).

And then, the control circuit 31 sets the operation mode to erase verify mode (step ST107). Thereby, the verify voltage generating circuit 11 generates erase verify voltage EVV and applies it to the X decoder 4. In the erase verify mode, the program voltage generating circuit 10 does not generate voltage, or at least, generates only voltage lower than the erase verify voltage EVV.

Subsequently, data stored in the same address as the read-out address in the program verify mode are read (step ST108). Then, the erase verify voltage EVV is applied to the control gate of the read-out memory cell through the X decoder 4.

The data read out are amplified by the sense amplifier 8 and become read data RD, and the read data RD are stored in the register B 32b in response to a clock signal CL from the control circuit 31 (step ST109).

Next, in response to a clock signal CL from the control circuit 31, the comparing circuit 33 compares content of the register A 32a and content of the register B 32b in correspondence of bits (step ST110). As a result of the comparison, if the content of the register A 32a and the content of the register B 32b are coincident, the processing is advanced to step ST113, and if both are different data, the processing is moved to step ST112 (step ST111).

As a result of decision in step ST111, if the content of the register A 32a and the content of the register B 32b are different, different bit is deemed to change from "0" to "1" due to disturb stress or the like, and "0" is written in the bit by the rewrite control means 31a (step ST112), and the processing is advanced to step ST113. The writing operation is carried out in that the control circuit 31 controls the program voltage generating circuit 10 to generate writing voltage, and "0" is written in corresponding bit of corresponding address. The case of changing from "1" to "0" is possible as defective data, but since such case is much by far that high voltage is applied to control gate or drain of a non-selected cell, thereby, charge of a floating gate is drawn and the stored data are changed from "0" to "1," in the embodiment of the present invention, when a defective bit is detected, data of the bit are all rewritten to "0." If defective data are detected again in checking of data before the final shipment to the user, the memory array will be abandoned.

In step ST113, it is confirmed whether an address set to the address register 6 by the control circuit 31 is final address of the memory array 1 or not. If it is not final address, the address is incremented by the address incrementing means 31b (step ST114), and the processing is returned to step ST104. If it is final address, the data refresh operation of the memory array 1 is finished (step ST115).

Thus, regarding all addresses of the memory array 1, data read out in program verify mode and data read out in erase verify mode are compared, thereby, defective data are detected and corrected and data in the flash memory as a whole can be refreshed.

In addition, if any address is assigned by the control circuit 31, it can be detected whether data stored in the memory cell are defective or not. If the data are defective, they can be corrected.

In the flow chart shown in FIG. 3, although program verify mode is set and then erase verify mode is set, even if this order is reversed, defective data can be retrieved and corrected in similar manner to the above description.

In the embodiment 1 as stated above, since data read out in program verify mode and data read out in erase verify mode are compared in each read-out address, regarding the memory array as a whole, time required for refresh of data becomes long. In the embodiment 2 as hereinafter described, the time required for refresh of data is reduced.

Embodiment 2

Figure 4:
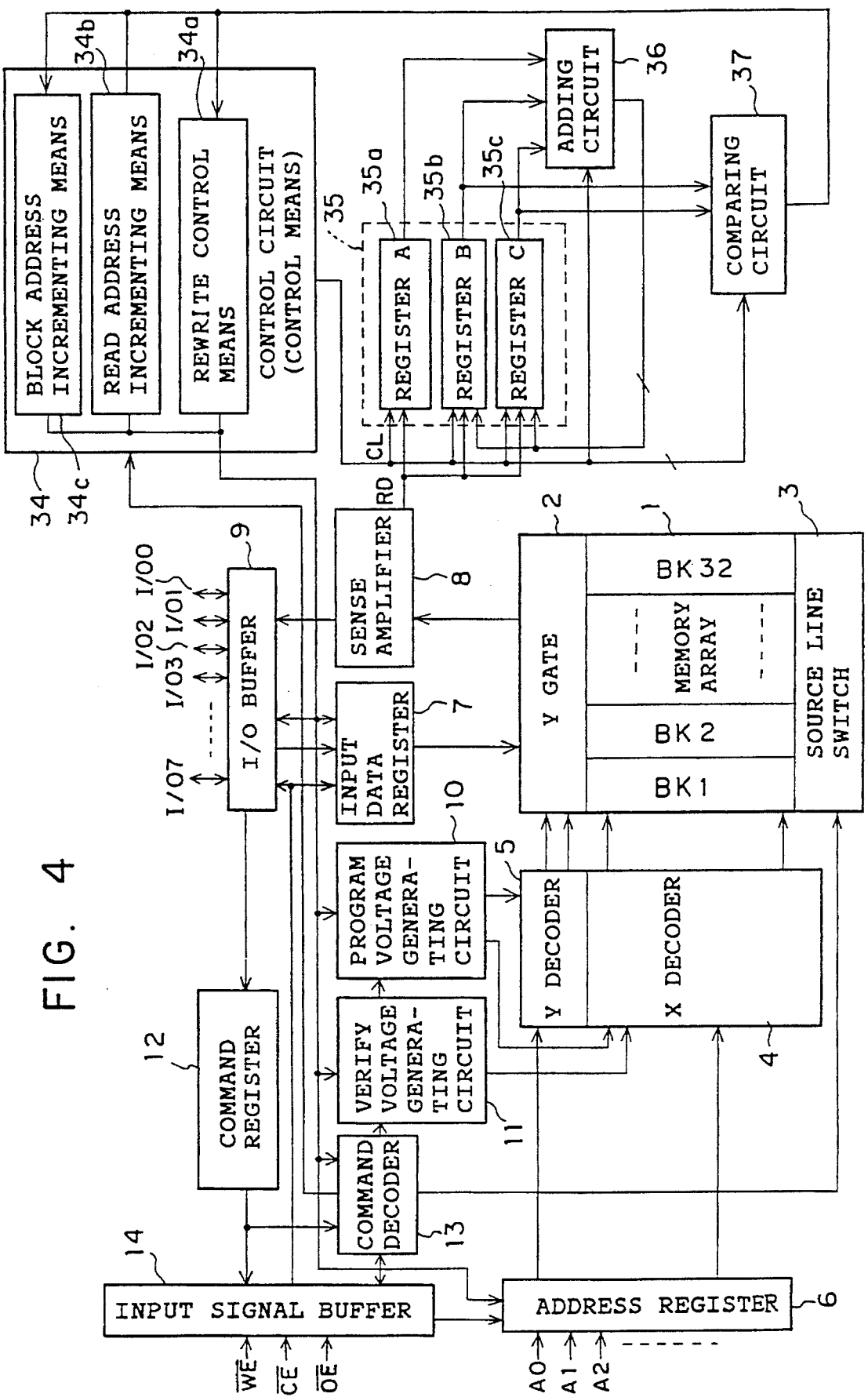
FIG. 4 is a block diagram showing constitution of a flash memory according to the embodiment 2 of the invention.

Another embodiment of the present invention will be described as follows. FIG. 4 is a block diagram showing constitution of a flash memory according to the embodiment 2 of the present invention. In FIG. 4, a control circuit (control means) 34 is activated when command inputted from an I/O buffer 9 and decoded by a command decoder 13 is refresh command of defective data, and controls a register group 35, an adding circuit 34 and a comparing circuit 37, and assigns block addresses of plural blocks in sequence and assigns a read-out address in the assigned block, and sets the program verify mode and the erase verify mode in different timing at verify operation state. When inconsistency is detected between data read out in program verify mode from an assigned address in the block with defective bits existing and data read out in erase verify mode from the same address by the comparing circuit 37, rewrite control means 34a controls to rewrite only data of a memory cell corresponding to the inconsistent data. Read address incrementing means 34b increments a read-out address in order to read data from all memory cells in each block. Block address incrementing means 34c increments a block address, when coincidence of adding results of data read out in each block is detected by the comparing circuit (comparing means) 37 or after the rewrite by the rewrite control means 34a. The register group 35 comprises three registers, a register A 35a, a register B 35b (first memory means) and a register C 35c (second memory means), all to be used when it is checked whether data stored in the memory are defective or not. The register B 35b stores adding results of data read out in program verify mode from all memory cells in each block address assigned by the control circuit 34, and the register C 35c stores adding results of data read out in erase verify mode from all memory cells in the same block as that described above. The adding circuit 36, in each block of the memory array 1, adds content of the register A 35a and the register B 35b and stores the adding result in the register B 35b in program verify mode, and adds content of the register A 35a and the register C 35c and stores the adding result in the register C 35c in erase verify mode. The comparing circuit 37, in each block of the memory array 1, compares content of the register B 35b and content of the register C 35c and detects a block with defective bits existing, and compares data read out in program verify mode from an assigned address in the block with defective bits existing and data read out in erase verify mode from the same address. Other parts in FIG. 4 are the same as those in FIG. 1, and the description shall be omitted.

Also in this embodiment, the rewrite control means 34a, the read address incrementing means 34b and the block address incrementing means 34c may be installed outside the control circuit 34.

Figure 5:
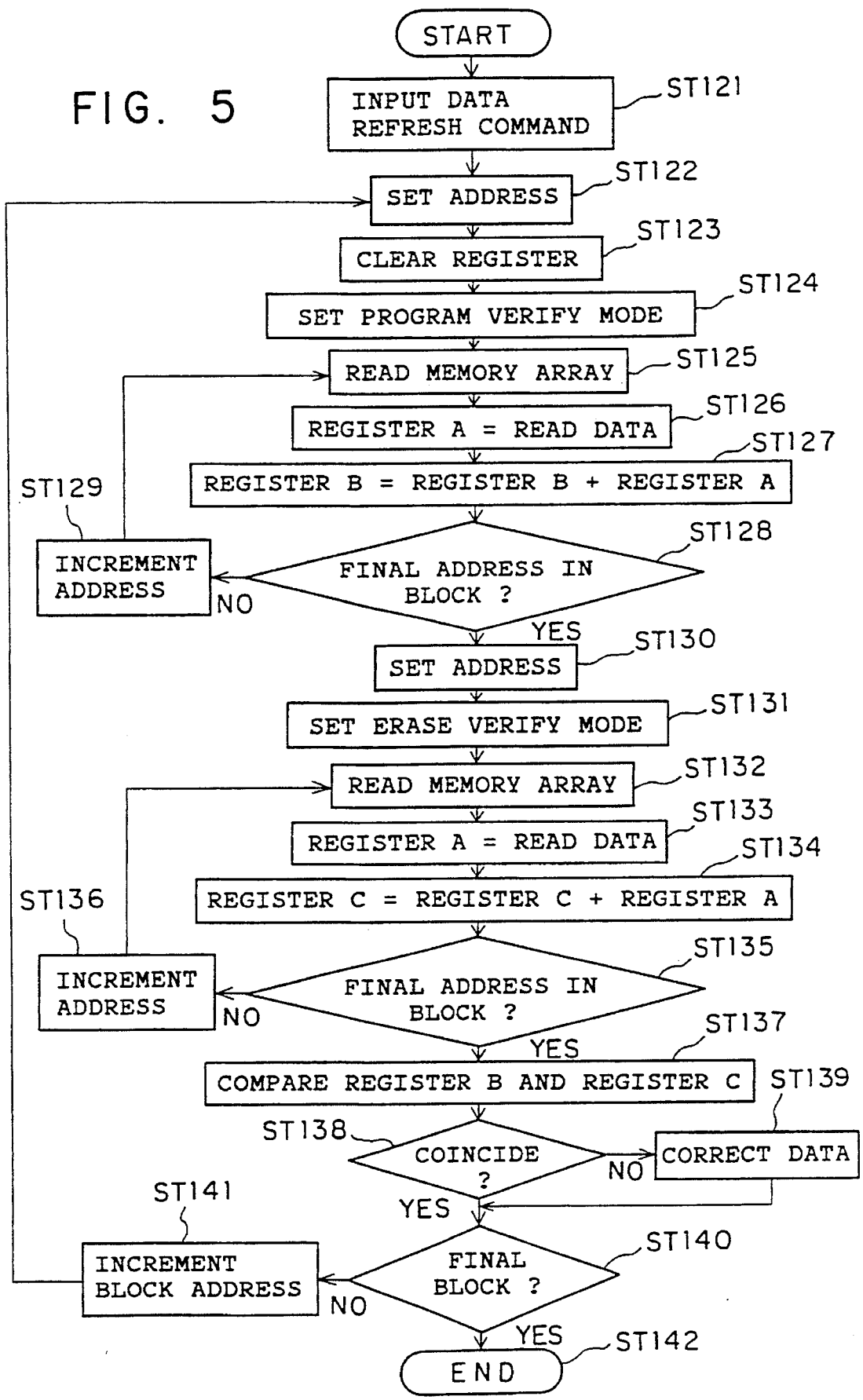
FIG. 5 is a flow chart explaining data refresh operation of the flash memory shown in FIG. 4.

Next, operation will be described. FIG. 5 is a flow chart explaining data refresh operation in the flash memory shown in FIG. 4. In FIG. 4 and FIG. 5, at first, data refresh command is inputted from the I/O buffer 9 to the command decoder 13 (step ST121). The command decoder 13 decodes the data refresh command and inputs it to the control circuit 34. Thereby, the control circuit 34 makes the operation mode data refresh mode. Subsequent operation is controlled by the control circuit 34.

The control circuit 34 first controls the address register 6 and sets the block address, for example, to the front block of the memory array 1, and initializes the read-out address, for example, to the front address in the block (step ST122).

Next, content of the register A 35a, the register B 35b and the register C 35c is cleared (step ST123).

Next, the operation mode is set to program verify mode (step ST124). Thereby, the verify voltage generating circuit 11 generates program verify voltage PVV and applies it to the X decoder 4.

Next, an address signal assigning the front address is supplied from the address register 6 to the X decoder 4 and the Y decoder 5, and data stored in one or plural memory cells assigned by the front address of the memory array 1 are read (step ST125). For example, if one word is eight bits in the memory, data of eight bits are read simultaneously. Then, the program verify voltage PVV is applied to the control gate of the memory cell read out through the X decoder 4.

The data read out are amplified by the sense amplifier 8 and becomes read data RD, and the read data RD are stored in the register A 35a in response to a clock signal CL from the control circuit 34 (step ST126).

Next, in response to a clock signal CL from the control circuit 34, the adding circuit 36 adds content of the register A 35a and content of the register B 35b, and stores the adding result in the register B 35b (step ST127).

Next, in step ST128, decision is effected regarding whether the read-out address is the final address in the block or not. If it is not the final address, the read-out address is incremented (step ST129), and the processing is returned to step ST125. If the read-out address is the final address in the block, the processing is moved to step ST130. Thus according to steps from ST124 to ST129, adding of the data read out in program verify mode is carried out regarding one block and the adding value is stored in the register B 35b.

Next, the read-out address is set again to the initial setting value (step ST130), subsequently, the operation mode is set to erase verify mode. Thereby, the verify voltage generating circuit 11 generates erase verify voltage EVV and applies it to the X decoder 4. In the erase verify mode, the program voltage generating circuit 10 does not generate voltage, or generates voltage lower than the erase verify voltage EVV.

Subsequently, data are read from the read-out address set to the memory array 1 (step ST132). Then the erase verify voltage EVV is applied to the control gate of the memory cell read out through the decoder 4.

The data read out are amplified by the sense amplifier 8 and become read data RD, and the read data RD are stored in the register A 35a in response to a clock signal from the control circuit 34 (step ST133).

Next, in response to a clock signal CL from the control circuit 34, the adding circuit 36 adds content of the register A 35a and content of the register C 35c, and stores the adding result in the register C 35c (step ST134).

Subsequently, in step ST135, decision is effected regarding whether the read-out address is the final address in the block or not. If it is not the final address, the read-out address is incremented (step ST136), and the processing is returned to step ST132. If the read-out address is the final address in the block, the processing is moved to step ST137.

Thus, according to steps from ST131 to ST136, the data read out in erase verify mode are added regarding one block, and the adding value is stored in the register C 35c.

In step ST138, the adding value obtained in program verify mode regarding one block and the adding value obtained in erase verify mode regarding the same block are compared. That is, content of the register B 35b and content of the register C 35c are compared (step ST137). If both are the same data, the processing is moved to step ST140, and if both are different data, the processing is moved to step ST139 and the data are corrected.

In step ST140, it is confirmed whether the block address is the final block of the memory array 1 or not. If it is not the final block, the block address is incremented (step ST141), and the processing is returned to step ST122 and next block is checked and defective data are corrected. If it is the final block, operation of retrieving and correcting the defective data is finished.

Figure 6:
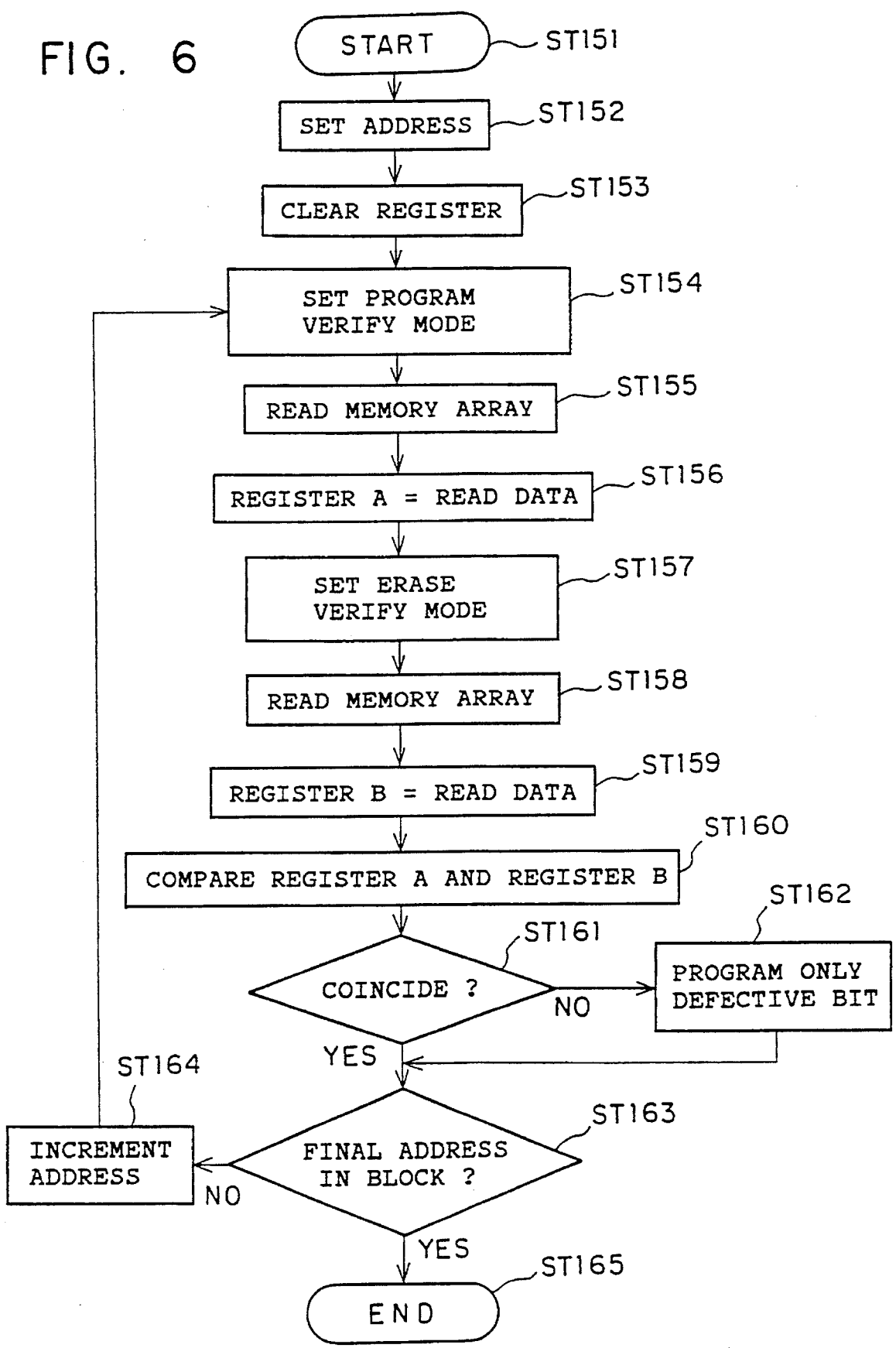
FIG. 6 is a flow chart explaining data correcting operation in FIG. 5.

FIG. 6 is a flow chart explaining operation of correcting data in step ST139 of FIG. 5. This embodiment is similar to the embodiment 1 described regarding FIG. 1 and FIG. 3 in manner of detection of defective bits and program. Both embodiments are different in that in the embodiment 1, defective bits are retrieved and corrected regarding the memory array as a whole, whereas, in the embodiment 2 shown in FIG. 6, defective bits are retrieved and corrected only in the block where existence of defective data is clear.

In FIG. 6, this operation is carried out when defective data exist in some block (step ST151). At first, a read-out address is set to the front address in a block where existence of defective data is clear in step ST139 of FIG. 5 (step ST152). Next, content of the register group 35 is cleared (step ST153).

Next, the operation mode is set to program verify mode (step ST154). Subsequently, data stored in one or plural memory cells assigned by a set address are read (step ST155). The data read out are stored in the register A 35a through the sense amplifier 8 (step ST156).

And then, the control circuit 31 sets the operation mode to erase verify mode (step ST157). Subsequently, data stored in the same address as the read-out address in the program verify mode are read (step ST158). The data read out are stored in the register B 35b through the sense amplifier 8 (step ST159).

Next, the comparing circuit 37 compares content of the register A 35a and content of the register B 35b in correspondence of bits (step ST160). As a result of the comparison, if the content of the register A 35a and the content of the register B 35b are coincident, the processing is advanced to step ST163, and if both are different data, the processing is moved to step ST162 (step ST161).

As a result of the decision in step ST161, if the content of the register A 35a and the content of the register B 35b are different, "0" is written in the bit (step ST162), and the processing is advanced to step ST163. Also in the embodiment 2 of the present invention, when a defective bit is detected, data of the bit are all written to "0," and if defective data are detected again in check of data before the final shipment to the user, the memory cell is abandoned.

In step ST163, the control circuit 34 confirms whether address set to the address register 6 is the final address in the block or not. If it is not the final address, the address is incremented (step ST164), and the processing is returned to step ST154. If it is the final address, the data refresh operation in the block is finished (step ST165).

Thus, data read out in program verify mode and data read out in erase verify mode are compared in block unit of the memory array 1, thereby, defective data can be detected and corrected and refresh of data can be carried out in a short time in comparison with the embodiment 1. In addition, in FIG. 5 and FIG. 6, even if setting order of program verify mode and erase verify mode is reversed, equivalent effect can be obtained in similar manner to the embodiment 1.

In the embodiment 1 and the embodiment 2, when the memory array 1 is chips of 4M bits constituted by 32 blocks and one block is 16K bytes and defective data exist in only one bit among them, comparison of time required for detecting and correcting defective data is as follows. Where reading time of one address is 150 nano seconds, and time required for changing from program verify mode to erase verify mode is 2 micro seconds.

In the embodiment 1, reading time of all addresses is 150 nano seconds×512K bytes×2= about 0.12 seconds, and mode changing time in all addresses is 2 micro seconds× 512K bytes = about 2.1 seconds. Consequently, time required for carrying out the data refresh regarding all addresses is sum of the reading time of all addresses and the mode changing time and therefore becomes about 2.3 seconds.

In the embodiment 2, reading time of all addresses in one block is 150 nano seconds×16K bytes×2=4.8 milli seconds, and mode changing time in one block is 2 micro seconds×

2=4 milli seconds. Consequently, measuring time of all blocks becomes (4.8 milli seconds+4 milli seconds)×32 blocks= about 281.6 milli seconds.

On the other hand, reading time in one block with defective bits existing is (mode changing time)×2×16K bytes+ read one cycle×16K bytes×2=2 micro seconds×2× 16K bytes+150 nano seconds×16K bytes×2, and becomes about 68.8 milli seconds in calculation. Consequently, time required for reading the whole apparatus becomes about 350.4 milli seconds, and time required for detecting and correcting the defective bits is significantly reduced in comparison with the embodiment 1.

In the embodiments as stated above, although the memory array is constituted by 32 blocks and there are eight data blocks in each block, the present invention is not limited to this example, but equivalent effect can be obtained even if the number of blocks to constitute the memory array and the number of data blocks in each block are changed.

Also in the embodiments as stated above, rising state of the threshold voltage of the memory cell is defined as information "0" and falling state of the threshold voltage is defined as information "1," however, definition reversed to this, of course, may be made.

According to the first aspect of the present invention, in a flash memory having data refresh function, since comparing means compares data read out in program verify mode and data read out in erase verify mode, and detects whether both data are inconsistent or not, effect is in that even if the data are varied and become defective data after the verify immediately after the write in the memory cell or immediately after the erase, the defective data in any address can be detected and corrected.

Since a read-out address is incremented after the rewrite by the rewrite control means in the invention of the first aspect, defective data can be retrieved and corrected regarding all memory cells in the flash memory and the number of flash memories which must be inevitably abandoned in the test before shipment of flash memories can be significantly reduced. As a result, effect is in that waste in manufacturing of a flash memory is reduced, thence, the price of the flash memory can be reduced.

According to the invention of the second aspect, since the adding result of data read out in program verify mode from all memory cells in one block and the adding result of data read out in erase verify mode from all memory cells in the same block as that described above are compared, and if inconsistency is detected, data of the memory cell corresponding to inconsistent data are rewritten, defective data can be retrieved in each block. Consequently, effect is in that the defective data can be retrieved and corrected further in a short time in comparison with the invention of the first aspect.

In the invention of the second aspect, since an address is incremented when the compared results are coincident or after the correction, and a block address is incremented when the adding results in the block are coincident or after the correction of data, effect is in that a memory cell storing defective data among all memory cells can be retrieved and corrected in each block, and the defective data can be retrieved and corrected regarding all memory cells of the flash memory further in a short time in comparison with the invention of the first aspect.

In the invention of the first or second aspect, in response to one read-out address signal, since data comprising one or more bits are compared, and only data of the memory cell corresponding to inconsistent bits are rewritten, in addition to the invention of the first or second aspect, effect is in that the defective data can be retrieved and corrected efficiently.

Further, whether correct data are in information erase state, since the defective data are rewritten in information write state, effect is in that the defective data can be corrected simply.

According to the invention of the third aspect, since data read out in program verify mode and data read out in erase verify mode are compared and it is detected whether the data are inconsistent or not, effect is in that even if data are varied and become defective data after verify immediately after the write in the memory cell or immediately after the erase, the defective data of any address can be retrieved and corrected.

In the invention of the third aspect, further since a read-out address is incremented after the rewrite of defective data, effect is in that the defective data can be retrieved and corrected regarding all memory cells in the flash memory.

According to the fourth aspect of the present invention, since defective data are retrieved in each block and the defective data of any address in the defective block are retrieved and corrected, effect is in that the defective data can be retrieved and corrected further in a short time in comparison with the invention of the third aspect.

In the invention of the fourth aspect, since an address is incremented when the compared results are coincident or after the correction of data, and a block address is incremented when the adding results are coincident in the block or after the correction of data, effect is in that the defective data can be retrieved and corrected regarding all memory cells in the flash memory further in a short time in comparison with the invention of the third aspect.

Also, in the invention of the third aspect or the fourth aspect, since data comprising one or more bits are compared and only data of the memory cell corresponding to inconsistent bits are written, in addition to actions of the third aspect or the fourth aspect, effect is in that the defective data can be retrieved and corrected efficiently.

Further, in the invention of the fourth aspect, whether correct data are in information write state or information erase state, since the defective data are rewritten in information write state, effect is in that the defective data can be corrected simply.

Further, according to the fifth aspect of the present invention, since order of program verify mode and erase verify mode in the invention of the third aspect is reversed, effect is in that the defective data can be retrieved and corrected in similar manner to the invention of the third aspect.

Further, according to the sixth aspect of the present invention, since order of program verify mode and erase verify mode in the invention of the fourth aspect is reversed, effect is in that the defective data can be retrieved and corrected in similar manner to the invention of the fourth aspect.

What is claimed is:

1. A flash memory having data refresh function, permitting verify operation of writing and erasing data to and from a memory cell utilizing program verify mode and erase verify mode, said flash memory comprising:

comparing means for comparing data read out in the program verify mode in response to assignment of a read-out address and data read out in the erase verify mode in response to assignment of the same address as the read-out address; and rewrite control means for controlling rewrite of data of a memory cell corresponding to inconsistent data, when the inconsistent data are detected by said comparing means.

2. A flash memory having data refresh function as set forth in claim 1, comprising:

control means for assigning a read-out address, and for setting the program verify mode and the erase verify mode in different reading timing;

first memory means for storing data read out in the program verify mode in response to assignment of a read-out address by said control means, and for supplying the data to said comparing means;

second memory means for storing data read out in the erase verify mode in response to assignment of the same address as the read-out address, and for supplying the stored data to said comparing means; and address incrementing means for incrementing the read-out address, when coincidence is detected by said comparing means or after the rewrite by said rewrite control means.

3. A flash memory having data refresh function as set forth in claim 2, wherein a plurality of memory cells are provided, and said first memory means stores data comprising one or more bits read out from one or more memory cells in the program verify mode in response to one read-out address, and said second memory means stores data comprising one or more bits read out from one or more memory cells in the erase verify mode in response to said one read-out address, and said rewrite control means controls the rewrite of only data of a memory cell corresponding to inconsistent bits, when the inconsistent bits are detected by said comparing means.

4. A flash memory having data refresh function as set forth in claim 3, wherein said rewrite control means rewrites data of a memory cell corresponding to the inconsistent bits in information write state.

5. A flash memory having data refresh function, permitting verify operation of writing and erasing data utilizing program verify mode and erase verify mode and comprising plural blocks each comprising plural memory cells, said flash memory comprising:

comparing means for comparing an adding result of data read out from all memory cells in one block of the plural blocks in the program verify mode and an adding result of data read out from all memory cells in the same block as said one block in the erase verify mode, and for comparing data read out in the program verify mode in response to assignment of a read-out address and data read out in the erase verify mode in response to assignment of the same address as the read-out address, in a block where inconsistency of the adding results is detected; and rewrite control means for controlling the rewrite of data of a memory cell corresponding to inconsistent data, when the inconsistent data are detected by said comparing means.

6. A flash memory having data refresh function, permitting verify operation of writing and erasing data utilizing program verify mode and erase verify mode and comprising plural blocks each comprising plural memory cells, said flash memory comprising:

control means for assigning addresses of the plural blocks in sequence and assigning a read-out address in the assigned block, and for setting the program verify mode and the erase verify mode in different reading timing during data refresh operation;

first memory means for storing an adding result of data read out from all memory cells in one block corresponding to a block address assigned by said control means in the program verify mode;

second memory means for storing an adding result of data read out from all memory cells in said one block in the erase verify mode; and comparing means for comparing the adding results stored in said first and second memory means, said first memory means further storing data read out in the program verify mode in a block where inconsistency is detected and in response to assignment of a read-out address, when the inconsistency of the adding results is detected by said comparing means, said second memory means further storing data read out in the erase verify mode in response to assignment of the same address as the read-out address, said flash memory further comprising:

rewrite control means for controlling the rewrite of data of a memory cell corresponding to data where inconsistency is detected by said comparing means;

read address incrementing means for incrementing the read-out address, when coincidence is detected by said comparing means or after the rewrite by said rewrite control means; and block address incrementing means for incrementing the block address, when coincidence of the adding results is detected by said comparing means or after the rewrite by said rewrite control means.

7. Data refresh method of a flash memory for retrieving and correcting defective data, permitting verify operation of writing and erasing data to a memory cell utilizing program verify mode and erase verify mode, said method comprising:

step of reading data in the program verify mode in response to assignment of a read-out address;

step of reading data in the erase verify mode in response to assignment of the same address as the read-out address;

step of comparing the data read out; and step of rewriting data of a memory cell corresponding to inconsistent data, when the inconsistent data are detected by the comparing step.

8. Data refresh method of a flash memory as set forth in claim 7, further comprising:

step of storing data read out in the program verify mode in response to assignment of a read-out address before the comparing step;

step of storing data read out in the erase verify mode in response to assignment of the same address as the read-out address before the comparing step; and step of incrementing the read-out address, when coincidence is detected by the comparison or after the rewrite.

9. Data refresh method of a flash memory as set forth in claim 8, wherein in the storing step, data comprising one or more bits read out from one or more memory cells are stored in response to one read-out address, and in the rewriting step, when inconsistent bits are detected by the comparison, only data of a memory cell corresponding to the inconsistent bits are rewritten.

10. Data refresh method of a flash memory as set forth in claim 9, wherein in the rewriting step, data of a memory cell corresponding to the inconsistent bits are rewritten in information write state.

11. Data refresh method of a flash memory, permitting verify operation of writing and erasing data utilizing program verify mode and erase verify mode and comprising plural blocks each comprising plural memory cells, said method comprising:

step of adding data read out from all memory cells in one block of the plural blocks in the program verify mode;

step of adding data read out from all memory cells in the same block as said one block in the erase verify mode;

step of comparing the adding results;

step of comparing data read out in the program verify mode in response to assignment of a read-out address and data read out in the erase verify mode in response to assignment of the same address as the read-out address, in a block where inconsistency of the adding results is detected by the comparison; and step of rewriting data of a memory cell corresponding to inconsistent data, when the inconsistent data are detected by the comparison.

12. Data refresh method of a flash memory, permitting verify operation of writing and erasing data utilizing program verify mode and erase verify mode and comprising plural blocks each comprising plural memory cells, said method comprising:

step of assigning block addresses of the plural blocks in sequence and assigning a read-out address in the assigned block and setting the program verify mode and the erase verify mode in different reading timing during the data refresh operation;

step of storing an adding result of data read out from all memory cells in one block corresponding to the assigned block address in the program verify mode;

step of storing an adding result of data read out from all memory cells in said one block in the erase verify mode;

step of comparing the stored adding results;

step of storing data read out in the program verify mode in response to assignment of a read-out address by said control means, in a block where inconsistency of the adding results is detected by the comparison;

step of storing data read out in the erase verify mode in response to assignment of the same address as the read-out address;

step of comparing the stored data;

step of rewriting data of a memory cell corresponding to data where coincidence is detected by the comparison;

step of incrementing the read-out address, when coincidence is detected by the comparing step or after the rewriting step; and step of incrementing the block address, when coincidence of the adding results is detected by the comparison or after the rewrite by the rewriting step.

13. Data refresh method of a flash memory, permitting verify operation of writing and erasing data to a memory cell utilizing program verify mode and erase verify mode, said method comprising:

step of reading data in the erase verify mode in response to assignment of a read-out address;

step of reading data in the program verify mode in response to assignment of the same address as the read-out address;

step of comparing the data read out; and step of rewriting data of a memory cell corresponding to inconsistent data, when the inconsistent data are detected by the comparing step.

14. Data refresh method of a flash memory, permitting verify operation of writing and erasing data utilizing program verify mode and erase verify mode and comprising plural blocks each comprising plural memory cells, said method comprising:

step of adding data read out from all memory cells in one block of the plural blocks in the erase verify mode;

step of adding data read out from all memory cells in the same block as said one block in the program verify mode;

step of comparing the adding results;

step of comparing data read out in the erase verify mode in response to assignment of a read-out address and data read out in the program verify mode in response to assignment of the same address as the read-out address, in a block where inconsistency of the adding results is detected by the comparison; and step of rewriting data of a memory cell corresponding to inconsistent data, when the inconsistent data are detected by the comparison.

* * * * *